US006639304B1

United States Patent
Oggioni et al.

(10) Patent No.: US 6,639,304 B1
(45) Date of Patent: Oct. 28, 2003

(54) BALL GRID ARRAY MODULE

(75) Inventors: Stefano Oggioni, Milan (IT); Giuseppe Vendramin, Caravaggio (IT)

(73) Assignee: International Business Machines Corporation, Armonk, NY (US)

( * ) Notice: Subject to any disclaimer, the term of this patent is extended or adjusted under 35 U.S.C. 154(b) by 19 days.

(21) Appl. No.: 09/638,729

(22) Filed: Aug. 14, 2000

(30) Foreign Application Priority Data

Oct. 27, 1999 (GB) .............................................. 9925318

(51) Int. Cl.[7] .............................................. H01L 23/552
(52) U.S. Cl. ........................ 257/660; 257/701; 257/786
(58) Field of Search ................................. 257/660, 701, 257/786

(56) References Cited

U.S. PATENT DOCUMENTS

| | | | |
|---|---|---|---|
| 5,026,624 A | * 6/1991 | Day et al. | |
| 5,089,881 A | 2/1992 | Panicker | 357/80 |
| 5,151,770 A | 9/1992 | Inoue | 357/53 |
| 5,583,378 A | * 12/1996 | Marrs et al. | |
| 5,955,789 A | * 9/1999 | Vendramin | |
| 6,046,429 A | * 4/2000 | Datta | 219/121.69 |
| 6,188,305 B1 | * 2/2001 | Chang et al. | 336/200 |
| 6,222,156 B1 | * 4/2001 | Datta | |
| 6,351,393 B1 | * 2/2002 | Kresge et al. | 174/252 |

FOREIGN PATENT DOCUMENTS

| | | |
|---|---|---|
| EP | 0 459 179 A1 | 5/1991 |
| EP | 0 459 179 B1 | 5/1991 |
| EP | 0 872 888 A2 | 10/1998 |
| EP | 0 872 888 A3 | 5/1999 |
| FR | 2659184 | 5/1992 |
| JP | 10-326963 | 12/1998 |
| WO | WO 96/27282 | 9/1996 |

* cited by examiner

Primary Examiner—David E Graybill
(74) Attorney, Agent, or Firm—Schmeiser, Olsen & Watts; Arthur J. Samodovitz

(57) ABSTRACT

A Plastic Ball Grid Array electronic package of the Cavity Down type for use in HF application. The present invention allows to reduce the overall thickness of the package, by tailoring the different mechanical portions of the module structure (interconnection balls, grounded stiffener thickness). A thin dielectric layer is laid on a metal (e.g. copper) stiffener. A chip is attached on the same side of the dielectric layer and the electrical connections between the chip and the pads are done with metallic traces running on the surface of the dielectric layer. The external rows of balls are not connected to the circuit traces; they are electrically connected to the metal stiffener to realize the lateral shielding for the HF applications. The connection between the balls and the metal stiffener (which acts as the ground plane) is done by means of photovias. One of the more important aspects of the present invention is the dramatic reduction of the parasitic impedance.

8 Claims, 4 Drawing Sheets

X-SECTIONAL VIEW

- Plated through hole
- Analogue Ground connections
- Ground connections
- Power connections
- Signals connections

BALL GRID ARRAY MODULE

TECHNICAL FIELD

The present invention relates to Ball Grid Array (BGA) electronic modules and more particularly to BGA modules for High Frequency applications.

BACKGROUND OF THE INVENTION

A recent development of technology has introduced the use of Printed Circuit Board (PCB) laminates as substrates for the manufacturing of electronic modules which can be of the Single Chip Module (SCM) type or Multi Chip Module (MCM) type. These modules are provided with a plurality of conductive pads for electrical connection with electronic circuits (such as mother boards, back planes, application boards). The electrical connection is achieved by little spherical portions of solder alloy which give the name of Ball Grid Array (BGA) to this kind of electronic module. Usually such modules use PCB laminates made of organic material. These modules are usually called Plastic Ball Grid Arrays. The definition "Plastic" indicates the organic nature of the PCB as opposed to a ceramic substrate. Another example of a BGA module is the Tape BGA (TBGA) which uses a tape of organic material as substrate instead of the laminate.

When the number of input/output leads extending from the electronic devices is very high it is known to build the substrate as a multilayer substrate having multiple layers of conductive material, wherein each layer must be electrically coupled together. This requires creating through holes and/or via vias to interconnect each conductive layer. Through hole drilling and/or via creation is one of the most expensive PCB operations. Each layer of interconnections increases the cost of PCB. In addition, circuits which must travel across one layer, down a through hole and back across another layer are much poorer in electrical performance than circuits which can travel directly across a single layer. For this reason, when possible, a single layer is preferable to a multilayer substrate.

FIG. 1 is an example of a prior art PBGA of the Cavity Down type. In the Cavity Down modules (as opposed to the Chip-Up modules) the active element 107 is attached on the lower side of the module, on the same side of the solder balls 105 and it is positioned in a sort of cavity of the organic substrate 101, which completely surrounds the active element 107. This arrangement presents some advantages with respect to the Chip-Up PBGA module. One of the advantages is the reduced thickness of the resulting package, since the chip is "contained" in the substrate. Furthermore, these modules provide a better heat dissipation, because the active element is usually attached to a metal stiffener which constitutes the top face of the module and also acts as heat dissipator.

When PBGA packages are used in high-frequency applications they require Electro Magnetic Interference (EMI) shielding to avoid background interference with the product working frequency. The higher the frequency is, the shorter the related wave length. If the wave length is short enough, it can pass through the atomic structures between molecule and molecule and the signal can cross the materials commonly used for the manufacturing of the electronic packages. If this happens, the interferences/disturbances can reach the active circuit on the chip, couple with correct working signals, latching or delatching circuits in a completely arbitrary way, causing the chip functions to be unrecognizable or unusable and, in some cases, even physically damaging the application. In a normal environment, there are several possibilities for random signals with HF/Radio Frequency characteristics, such as electrical spikes, household disturbances, short wave rays (X-Rays) present in the atmosphere and many others. To avoid this major problem, it is necessary to protect the RF application with a kind of box made with a material having a very tight molecular structure, such as a metal, that cannot be crossed by the RF interferences but which reflects them back. This metal box operates as a Faraday cage that protects the application functionality.

It is known to manufacture devices for HF applications using an all metal cavity package to house the electronic circuit. In hybrid microelectronic circuits the substrate (usually ceramic) bearing silicon device is glued or brazed to bottom of the metal package. Then wire bonding interconnections are formed between substrate and package leads. Then the whole module is capped by brazing or welding a cover lid to the open cavity in order to get a one piece all metal package. The EMI shielding is thus obtained by grounding the metal envelope through internal interconnections.

However, this solution involves considerably high costs. Use of low cost organic packages would be very desirable.

EP-A-872888 (and the corresponding U. S. Pat. No. 5,955,789) provides a solution which allows the use of low cost, commonly available, base organic material to manufacture HF devices. EP-A-872888 provides an effective shielding from Electro Magnetic Interference (EMI) by building a sort of complete Faraday Cage, protecting the active device from atmospheric natural electromagnetic radiations of radio frequency, or the resulting disturbances in radio equipment interference.

According to EP-A-872888 a complete shielding of a module using an organic substrate is realized. The organic materials do not constitute a barrier for the HF wave. For this reason a metal fence is created along the sides of the substrate by a combination of solder balls and plated through holes connected together (for example) in a zig-zag way. As schematically shown in the plane view of FIG. 2 plated through holes 201 along the four sides of the organic substrate alternate with solder balls 202 and are connected to each other to constitute a "fence" which surrounds the whole module. This fence constitutes a shield which has been proven to be very effective for protecting against high frequency electromagnetic waves. Laboratory tests showed that a shielding like the one described above can be used to protect from a HF radiation of more than 1 GHZ. In a preferred embodiment, these through holes and solder balls are identical to the usual through holes and solder balls used for the manufacture of BGA modules, but have no connection with the active circuits. They are connected to ground for realizing the HF shielding. FIG. 2 schematically shows for example some of the solder balls 205 which realize the signal connections between the active device and the main board to which the module will be mounted.

Referring now to FIG. 3 the complete Faraday Cage realized according to EP-A-872888 is detailed. The active element 301 must be completely surrounded by the Faraday Cage in order to be shielded from the HF electromagnetic waves. The lateral sides of the Cage are constituted as explained above by the plated through holes 201, and by the solder balls 202 connected together. The through holes 201 provide a shielding within the substrate (which is according to the preferred embodiment an organic laminate), while the solder balls ensure a lateral protection between the substrate and the main board (when the module is finally mounted on the board). The ground plane 303 in the main board, properly connected to the solder balls 203, will constitute the lower side of the Faraday Cage, while the upper side, according to the preferred embodiment, will be realized by connecting the top metal plate 305, which usually constitutes the top side of a Cavity Down module, with the through holes 201.

As mentioned above, multilayer substrates have several drawbacks:

they need expensive drilling operations for the creation of through hole;

circuits traveling across the layers have poor electrical performances; and more important the thickness of the module cannot be reduced as desired.

Examples of applications needing a very thin module are small portable devices as the PCMCIA (Personal Computer Memory Card International Association) where a thickness of 1.2 mm and lower is an objective. Bumped devices do have a thickness between 0.5 to 0.8 mm making such a 1.2 mm objective difficult to reach without a very thin carrier. FR4 carriers thickness cannot be reduced too much otherwise they become very fragile and prone to high level of deformation because of the usage of several materials with different coefficients of thermal expansion, compromising easily the package reliability of the application.

Further product enhancements such as PDA (Portable Digital Assistant) and other portable multimedia applications will embed RF features such the Blutooth standard for wireless local area networking between appliances will drive the overall size of the package to thinner dimensions, and the same for GPS and GSM applications.

SUMMARY OF THE INVENTION

It is an object of the present invention to provide a technique which alleviates the above drawbacks.

According to the present invention, we provide a Ball Grid Array (BGA) package including:

a metal stiffener;

a dielectric layer laid on said metal stiffener;

a plurality of circuit traces on the dielectric layer, the traces having one end connectable to an active element mounted on the dielectric layer, and the other end connectable to a solder ball for connecting the active element to a mother board;

peripherally to the plurality of traces, a plurality of metallized photovias, each photovia being connected to the metal stiffener and connectable to a solder ball for connection with the mother board.

BRIEF DESCRIPTION OF THE DRAWINGS

The above and other advantages of the present invention will be better understood with reference to the following figures, where.

DETAILED DESCRIPTION OF THE PREFERRED EMBODIMENT

The present invention relates to a package for High Frequency applications, using e.g. GaAs, Si or SiGe devices. The present invention allows for reduction in the overall thickness of the package, by tailoring the different mechanical portions of the module structure (interconnection balls, grounded stiffener thickness).

Figure 1:
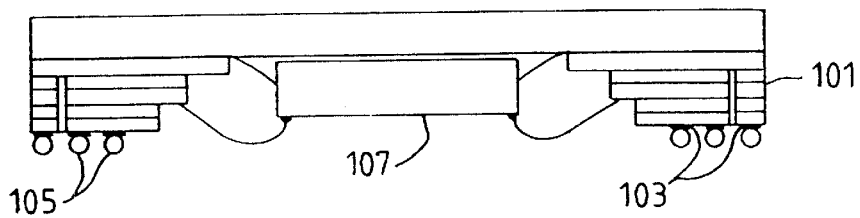
FIG. 1 is a schematic representation of a prior art BGA module of the Cavity Down type.
Figure 2:
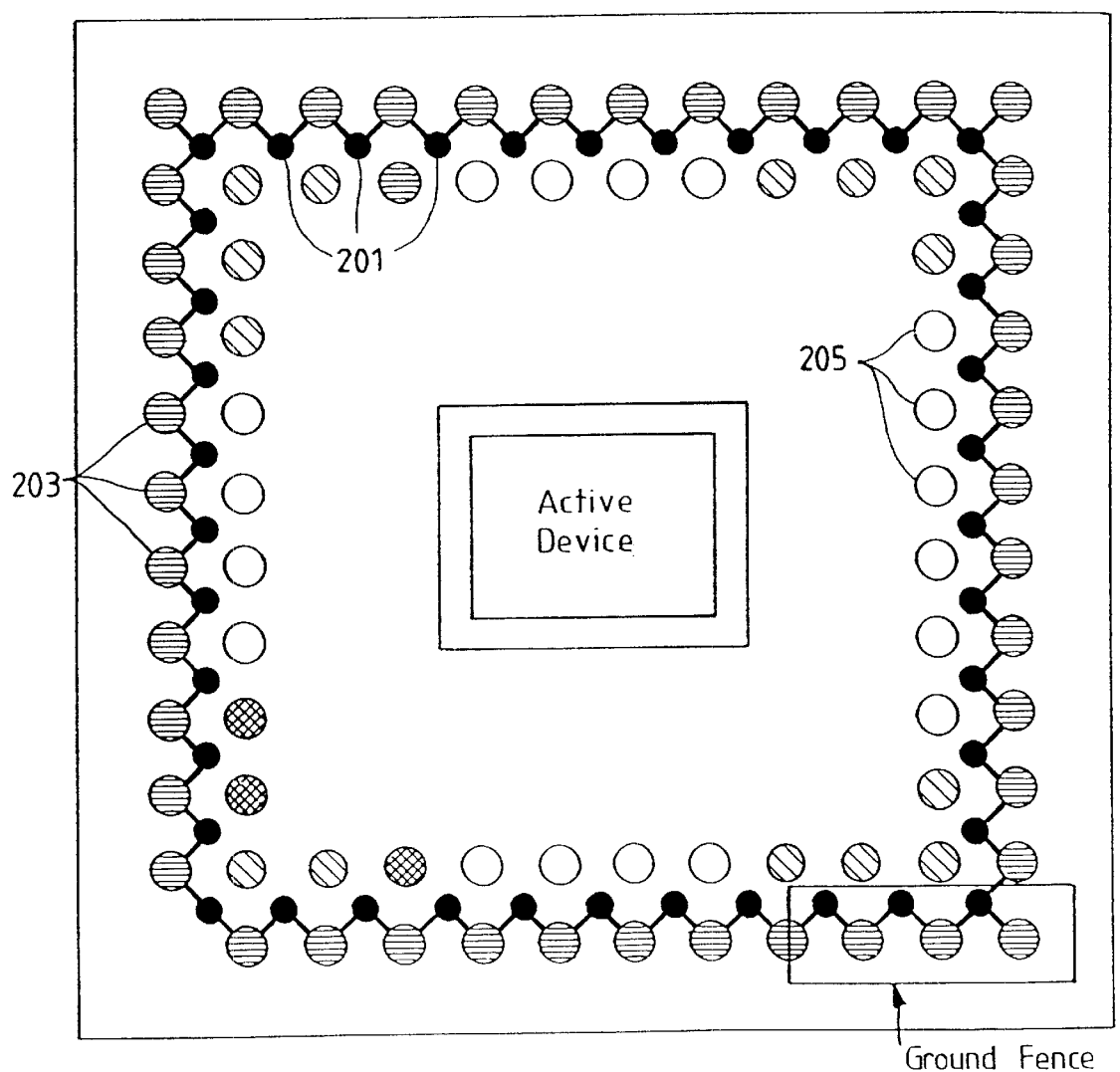
FIG. 2 is a plane view of a shielded BGA package according to the prior art.
Figure 3:
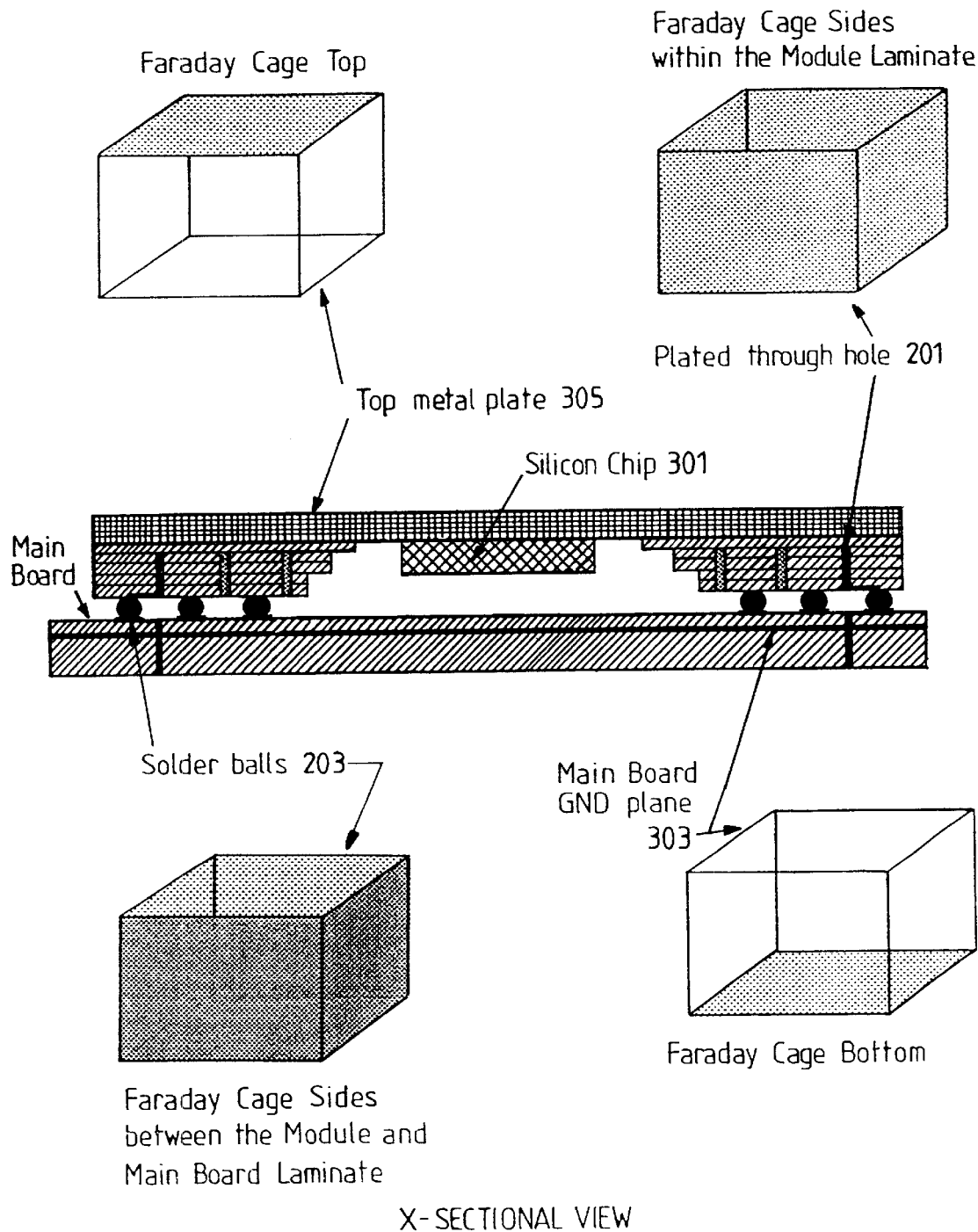
FIG. 3 is a cross section of a shielded BGA package according to the prior art.
Figure 4:
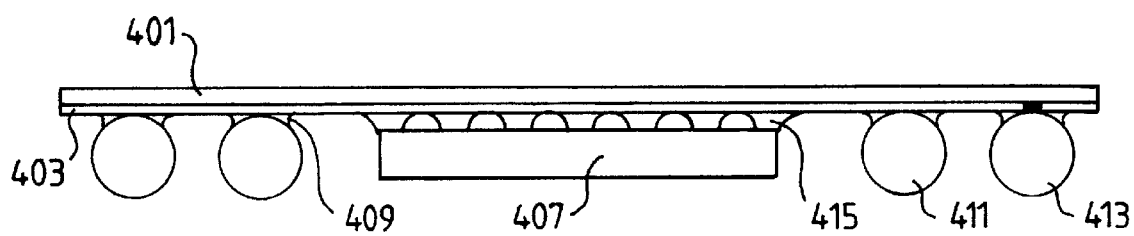
FIG. 4 is a schematical view of a preferred embodiment according to the present invention.
Figure 4A:
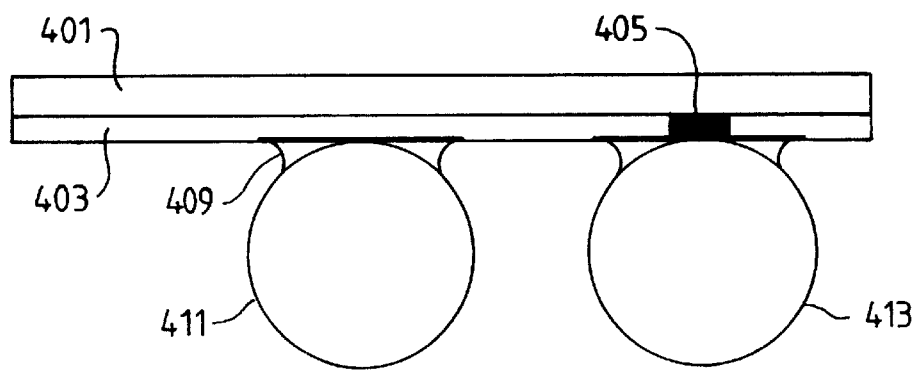
FIG. 4a is a detail of FIG. 4.

Referring now to FIG. 4 a preferred embodiment of the present invention is described. A thin dielectric layer 403 is laid on a metal (e.g. copper) stiffener 401. According to a preferred embodiment of the present invention, the dielectric layer 403 is photoimageable and its deposition is done by curtain coating process, where a PCB is driven at high speed through a curtain made of liquid coating; this is a mature process that allows high throughput and an excellent control on the thickness of the dispensed material over large surface areas. Once dispensed the dielectric undergoes polymerization by heat. When cured the dielectric layer is reduced by grinding to the desired thickness to better control the resulting electrical parameters of the resulting circuit impedance. Thickness of the dielectric layer is adjustable in the dispense operation changing the material properties i.e. the viscosity by changing the solid content, or process parameters such as the speed with which the PCB travels through the liquid material curtain. The typical value are in the range of 80 $\mu$m with an upper limit of 115 $\mu$m. The lower limit can be reduced down to a value of 25 $\mu$m. A thickness lower than 25 $\mu$m is considered difficult to be controlled on large PCB panels with possible undesirable dielectric failures due to irregularities in the dielectric composition uniformity. According to a preferred embodiment, the dielectric material is for example the photoimageable cationally polymerizable epoxy based material described in U. S. Pat. No. 5,026,624. This particular material includes an epoxy resin system consisting essentially of between about 10% and about 80% by weight of a polyol resin which is a condensation product of epichlorohydrin and bysphenol A having a molecular weight of between about 40,000 and 130,000; between about 20% and about 90% by weight of an epoxidized octafunctional bisphenol A formaldehyde novolac resin having a molecular weight of 4,000 to 10,000; and if flame retardancy is required between about 35% and 50% by weight of an epoxidized glycidyl ether of tetrabromo bisphenol A having a softening point of between about 60° C. and about 110° C. and a molecular weight of between about 600 and 2,500. To this resin system is added about 0.1 to about 15 parts by weight per 100 parts of resin a cationic photoinitiator capable of initiating polymerization of said epoxidized resin system upon exposure to actinic radiation; the system being characterized by having an absorbance of light in the 330 to 700 nm region of less than 0,1 $\mu$m. Optionally a photosensitizer such as perylene and its derivative or anthracene and its derivatives may be added.

Other conventional processes for Printed Circuit Board (PCB) manufacturing such as film lamination, rolling coating or curtain coating may be used instead, depending on the dielectric material and its preprocessing status (i.e. film, paste or liquid).

A chip 407 is attached on the same side of the dielectric layer 403 and the electrical connections between the chip and the pads 409 are done with metallic traces running on the surface of the dielectric layer 403. In a preferred embodiment of the present invention, the chip 407 is of the flip-chip type. Each pad 409 is provided with a solder ball 411 for mounting on a mother board as explained with reference to the prior art BGA modules. The external rows of balls 413 are not connected to the circuit traces; they are electrically connected to the metal stiffener 401 to realize the lateral shielding for the HF applications, as explained above with reference to the prior art patent application EP-A-872888. The connection between the balls 413 and the metal stiffener (which acts as the ground plane) 401 is done by means of photovias 405. These photovias are defined through a photolitographic process with selected areas of the dielectric surface exposed to light and then developed. This kind of photoimageable dielectric material, when exposed to light, undergoes a chemical change and polymerizes becoming non-soluble to the developer. The photovias are then metallized to ensure the electrical conduction. An alternative solution for the creation of said vias is to use a laser beam that can selectively burn the dielectric in the position required to create a via connection. In this case a photoimageable dielectric material is not strictly required.

The configuration described above, provides several advantages. One of the more important aspects is the dramatic reduction of the parasitic impedance. This reduction is possible, with the configuration according to a preferred embodiment of the present invention, for multiple factors. One of these factors is the elimination of the wires, which in a wire bonded chip are used to connect the chip with the circuit traces.

A wire bond has an inductance of approximately 1 nH/mm, while a single connection bump 415 of a flip chip has an inductance of about 0.1 nH. Considering that a single wire is usually longer than 1 mm, we obtain a reduction in the inductance of at least ten times, only by using a flip chip type instead of a wire bond chip.

The grounded stiffener, connected to the GND level through one or more photovias, acts as reference plane for the sequentially built up circuitry.

Figure 5:
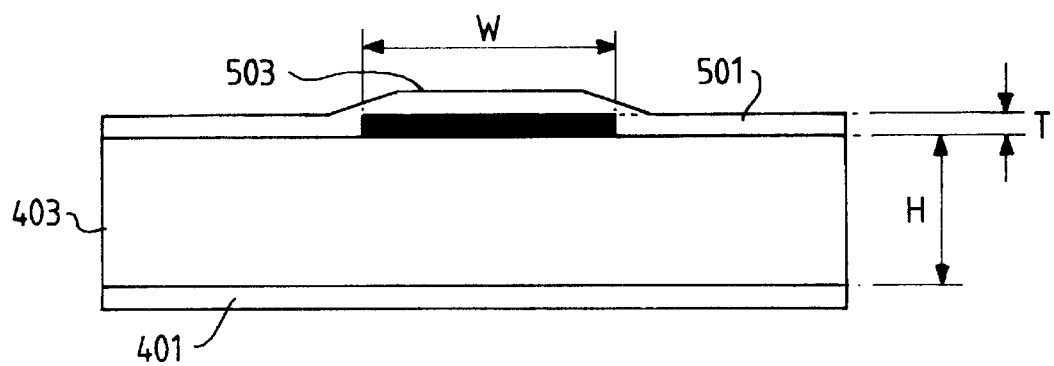
FIG. 5 is a schematical representation of the relationships between the factors influencing the package impedance.
Figure 6:
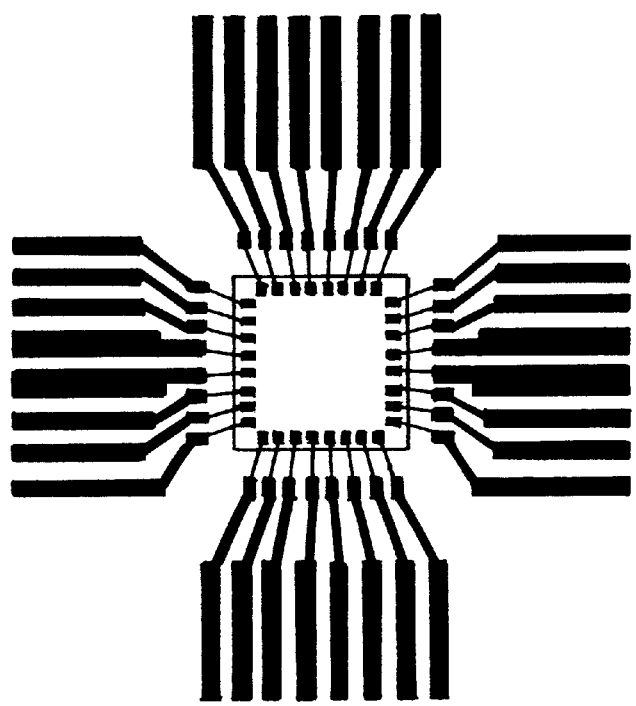
FIG. 6 is plane view of a circuit design with impedance control according to the prior art.
Figure 7:
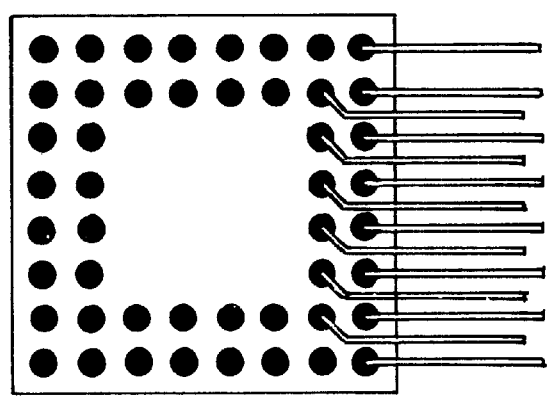
FIG. 7 is a plane view of a circuit design according to a preferred embodiment of the present invention.

FIG. 5 schematically represents the factors influencing the package impedance. Impedance is influenced by the thickness H of the dielectric 403 between the conductor trace 501 and the reference plane 401, by the thickness T of the conductor traces 501 and by the width W of the traces 503 and by the relative dielectric constant $\in_r$. In particular, the resulting impedance is proportional to the thickness T of the dielectric 403 and inversely proportional to the width W of conductor traces 503. In the prior art packages, it is known to control the impedance by increasing the trace width, since the dielectric thickness cannot be reduced to a great extent. FIG. 6 shows an example of a prior art circuit design. With the configuration according to the present invention, as shown in FIG. 7 it is possible to greatly reduce the width W of conductor traces, because the impedance is controlled by the limited thickness of the dielectric layer 403. The width reduction obtained by the present solution gives the advantage of allowing many more conductor traces to be drawn on the surface of the dielectric. This also avoids the need of a multiple layer substrate even with applications having many input/output lines. As an example, with a typical target impedance value of 50 ohm, a dielectric layer thickness of 40 $\mu$m, the trace width can be reduced to 50 $\mu$m.

Another result obtained by the above described configuration is to avoid the creation of through holes, which as mentioned above is a very expensive operation. On the contrary the creation of photovias 405 is a chip and easy operation. Furthermore the diameter of photovias is much smaller than drilled through holes: this allows to put the solder balls 413 over the photovias instead of offsetting the balls and connecting them with metallic traces to the through holes to avoid the balls collapsing into the through holes. This feature provides some additional space on the dielectric surface which can be used for circuit traces.

What is claimed:

1. An electronic package comprising:
    a metal member;
    a dielectric layer positioned on said metal member wherein said dielectric layer comprises a photoimageable dielectric material;
    an active element positioned on said dielectric layer;
    a first plurality of electrically conductive members positioned on said dielectric layer relative to said active element;
    a plurality of metallic traces on said dielectric layer, selected ones of said metallic traces in electrical contact with said active element and selected ones of said first plurality of electrically conductive members;
    a second plurality of electrically conductive members positioned on said dielectric layer;
    and at least one electrically conductive via in said dielectric layer said at least one of said second plurality to electrically conductive members in contact with said metal member not electrically coupled to said metallic traces.

2. The electronic package of claim 1, wherein said dielectric layer has a thickness of from 25 microns to 115 microns.

3. The electronic package of claim 1, wherein each to said plurality of metallic traces has a width of from 50 microns to 260 microns.

4. The electronic package of claim 1, wherein said second plurality of electrically conductive members is positioned on said dielectric layer peripherally to said first plurality of electrically conductive members.

5. The electronic package of claim 1, further including a mother board positioned on said first and said second plurality of electrically conductive members, said mother board including a ground plane.

6. The electronic package of claim 5, wherein said ground plane is electrically coupled to said metal member.

7. The electronic package of claim 6, wherein said metal member comprises an electromagnetic shield for said active element.

8. The electronic package of claim 1, wherein the photoimageable dielectric material undergoes a chemical change and polymerizes when exposed to light so as to become non-soluble to a developer solution.

* * * * *